United States Patent
Park et al.

(10) Patent No.: US 10,964,770 B2
(45) Date of Patent: *Mar. 30, 2021

(54) FLEXIBLE DISPLAY

(71) Applicant: SAMSUNG DISPLAY CO., LTD., Yongin-si (KR)

(72) Inventors: Gyungsoon Park, Yongin-si (KR); Minjae Jeong, Yongin-si (KR); Keumnam Kim, Yongin-si (KR); Sehyoung Cho, Yongin-si (KR); Jongho Hong, Yongin-si (KR)

(73) Assignee: SAMSUNG DISPLAY CO., LTD., Yongin (KR)

( * ) Notice: Subject to any disclaimer, the term of this patent is extended or adjusted under 35 U.S.C. 154(b) by 14 days.

This patent is subject to a terminal disclaimer.

(21) Appl. No.: 16/384,340

(22) Filed: Apr. 15, 2019

(65) Prior Publication Data

US 2019/0245027 A1      Aug. 8, 2019

Related U.S. Application Data

(63) Continuation of application No. 14/805,765, filed on Jul. 22, 2015, now Pat. No. 10,263,062.

(30) Foreign Application Priority Data

Dec. 31, 2014    (KR) .................. 10-2014-0195958

(51) Int. Cl.
*H01L 27/32*       (2006.01)
*H01L 51/00*       (2006.01)
*G09G 3/20*        (2006.01)

(52) U.S. Cl.
CPC ....... *H01L 27/3276* (2013.01); *G09G 3/2003* (2013.01); *H01L 51/0097* (2013.01);
(Continued)

(58) Field of Classification Search
CPC ............ H01L 51/0097; H01L 27/3276; H01L 27/3211
See application file for complete search history.

(56) References Cited

U.S. PATENT DOCUMENTS

2007/0290616 A1    12/2007  Lee et al.
2013/0041235 A1    2/2013   Rogers et al.
(Continued)

FOREIGN PATENT DOCUMENTS

KR    10-2014-0023045    2/2014
KR    10-2014-0042553    4/2014
(Continued)

*Primary Examiner* — Yu-Hsi D Sun
(74) *Attorney, Agent, or Firm* — F. Chau & Associates, LLC

(57) ABSTRACT

A flexible display is disclosed. In one aspect, the display includes at least one first pattern including a plurality of display elements configured to display an image and extending in a first direction. The display device also includes at least one second pattern extending in a second direction and overlapping at least a portion of the first pattern. The second pattern has a curved shape in the first direction and the second direction crosses the first direction. The first and second patterns form at least one cavity region defining a space therebetween and the first and second patterns form a mesh structure.

10 Claims, 7 Drawing Sheets

(52) U.S. Cl.
CPC . *G09G 2300/0426* (2013.01); *G09G 2380/02* (2013.01); *H01L 2251/5338* (2013.01); *Y02E 10/549* (2013.01)

(56) References Cited

U.S. PATENT DOCUMENTS

| | | |
|---|---|---|
| 2014/0049485 A1 | 2/2014 | Oh et al. |
| 2014/0097408 A1 | 4/2014 | Kim et al. |
| 2014/0138635 A1 | 5/2014 | Lee et al. |
| 2014/0138637 A1* | 5/2014 | Yang ................ H01L 27/1218 257/40 |
| 2015/0084003 A1 | 3/2015 | Kim et al. |
| 2016/0190223 A1 | 6/2016 | Park et al. |

FOREIGN PATENT DOCUMENTS

| | | |
|---|---|---|
| KR | 10-2014-0045193 | 4/2014 |
| KR | 10-2014-0063306 | 5/2014 |

\* cited by examiner

◄──────► FIRST DIRECTION

FLEXIBLE DISPLAY

RELATED APPLICATIONS

This application is a continuation of U.S. patent application Ser. No. 14/805,765 filed Jul. 22, 2015, which claims the benefit of Korean Patent Application No. 10-2014-0195958, filed on Dec. 31, 2014, in the Korean Intellectual Property Office, the disclosures of which are incorporated herein in their entireties by reference.

BACKGROUND

Field

The described technology generally relates to a display device.

Description of the Related Art

Display devices can be used for a variety of applications. As research and development is being directed towards thinner profile and lighter display devices, the range of possible applications increases. In particular, traditional display devices are being replaced with portable thin-film flat panel display devices.

With recent advancement in display-related technology, flexible displays that can be folded or rolled up have been developed. Furthermore, research and development on stretchable display devices that can be stretched into various shapes has been ongoing.

Thus, in order to meet users' growing demand for such display devices, display devices are being developed which are both flexible such that they can be folded or bent and stretchable such that they can be stretched in a specific direction.

However, the flexibility of display devices is limited since it depends on the material properties of the substrate and it is very difficult to manufacture display devices that are both flexible and durable.

SUMMARY OF CERTAIN INVENTIVE ASPECTS

One inventive aspect is a display device that is both stretchable and flexible.

Additional aspects will be set forth in part in the description which follows and, in part, will be apparent from the description, or may be learned by practice of the presented embodiments.

Another aspect is a display device including at least one first pattern unit including a plurality of display elements for displaying an image, and extending in a first direction; at least one second pattern unit extending in a second direction to overlap at least a portion of the at least one first pattern unit, and having a curved shape in the first direction, wherein the second direction crosses the first direction; and at least one penetration unit for penetrating a space surrounded by the at least one first pattern unit and the at least one second pattern unit, wherein the at least one first pattern unit and the at least one second pattern unit form a mesh structure.

The at least one first pattern unit can include a plurality of first wires extending in the first direction, and the at least one second pattern unit can include a plurality of second wires extending in the second direction to cross at least some of the plurality of first wires.

The at least one first pattern unit can include a plurality of first sub-pattern units, the at least one second pattern unit can include a plurality of second sub-pattern units, and the at least one penetration unit can include a plurality of sub-penetration units.

A first sub-pattern unit, a second sub-pattern unit and a sub-penetration unit that are formed adjacent to one another can form one pixel.

The plurality of first sub-pattern units can include a plurality of light-emitting regions, wherein the plurality of light-emitting regions each emit red, green, or blue light.

The plurality of second sub-pattern units each can have a curved shape protruded in the first direction.

A concave groove can be formed at an edge of each of the plurality of second sub-pattern units in the direction in which the plurality of second sub-pattern units are protruded.

Some wires included in the plurality of second sub-pattern units among the plurality of second wires can have a curved shape corresponding to the curved shapes of the plurality of second sub-pattern units.

The curved shapes of the plurality of second sub-pattern units can be tightly stretched when the at least one second pattern unit is stretched.

The plurality of second sub-pattern units can be arranged to be bent in alternating directions with respect to the at least one first pattern unit.

The plurality of second wires can include a plurality of wires, wherein the plurality of wires are electrically connected to the plurality of display elements, respectively.

At least one among the plurality of first wires can be a scan line for transmitting a scan signal to the pixel, and at least one among the plurality of second wires can be a data line for transmitting a data signal to the pixel.

At least one among the plurality of second wires can be a driving voltage line for applying a driving voltage to the pixel.

The at least one first pattern unit can further include an insulating layer formed between the plurality of first wires and the plurality of second wires.

The plurality of display elements can be arranged on the at least one first pattern unit to be spaced apart from each other.

The at least one first pattern unit and the at least one second pattern unit each can include a base at a bottom thereof, wherein the base is formed of a flexible material.

The base can include an organic material.

The plurality of display elements can include a first electrode; a second electrode; and an intermediate layer interposed between the first electrode and the second electrode, the intermediate layer including an organic emission layer.

Another aspect is a flexible display, comprising at least one first pattern including a plurality of display elements configured to display an image and extending in a first direction; and at least one second pattern extending in a second direction and overlapping at least a portion of the first pattern, wherein the second pattern has a curved shape in the first direction and wherein the second direction crosses the first direction, wherein the first and second patterns form at least one cavity region defining a space therebetween, and wherein the first and second patterns form a mesh structure.

In exemplary embodiments, the first pattern comprises a plurality of first wires extending in the first direction and wherein the second pattern comprises a plurality of second wires extending in the second direction to cross at least some of the first wires. The first pattern can comprise a plurality of first sub-patterns, the second pattern can comprise a plurality of second sub-patterns, and the cavity region can comprise a plurality of cavity sub-regions. Each of the first sub-patterns can comprise a plurality of light-emitting regions, and each of the light-emitting regions can emit red, green, or blue light.

In exemplary embodiments, each of the second sub-patterns has a curved shape protruded in the first direction. A concave groove can be formed at an edge of each of the second sub-patterns in the first direction. Each of the second sub-patterns can comprise a plurality of wires having a curved shape corresponding to the curved shapes of the second sub-patterns. The second sub-patterns can be arranged to be bent in alternating directions with respect to the first pattern. The second wires can be respectively electrically connected to the display elements.

In exemplary embodiments, at least one of the first wires is a scan line configured to apply a scan signal to the pixels and at least one of the second wires is a data line configured to apply a data signal to the pixels. At least one of the second wires can be a driving voltage line configured to apply a driving voltage to the pixels. The first pattern can further comprise an insulating layer formed between the first wires and the second wires. The display elements can be arranged on the first pattern and can be spaced apart from each other. The display can further comprise a substrate formed of a flexible material, wherein the first and second patterns are formed on the substrate. The substrate can comprise an organic material.

In exemplary embodiments, each of the display elements comprises a first electrode; a second electrode; and an intermediate layer interposed between the first electrode and the second electrode, wherein the intermediate layer comprises an organic emission layer.

BRIEF DESCRIPTION OF THE DRAWINGS

These and/or other aspects will become apparent and more readily appreciated from the following description of the exemplary embodiments, taken in conjunction with the accompanying drawings in which.

DETAILED DESCRIPTION OF CERTAIN INVENTIVE EMBODIMENTS

Figure 1:
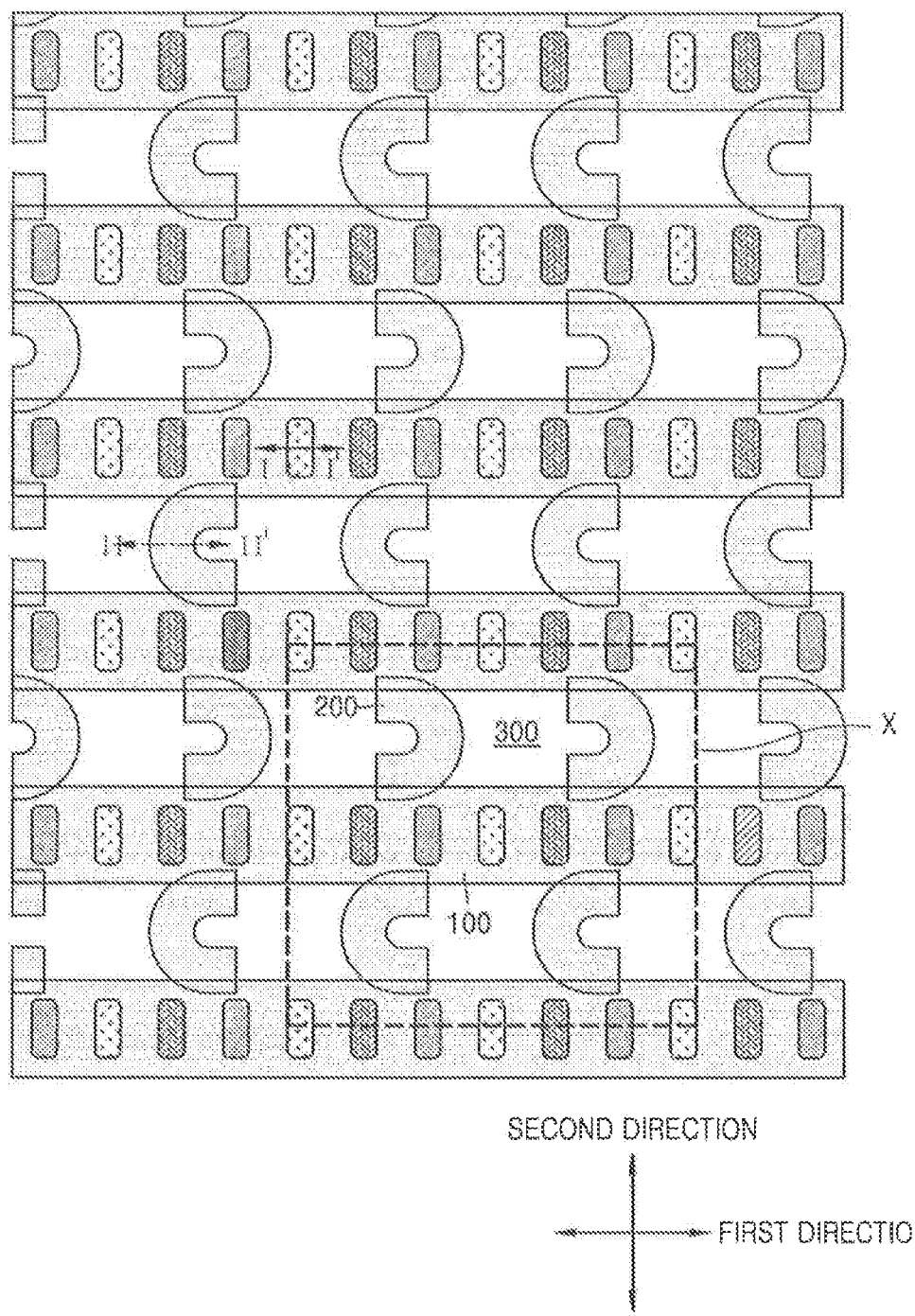
FIG. 1 is a schematic plan view of a display device according to an exemplary embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. It would be obvious to those of ordinary skill in the art that exemplary embodiments are to cover all modifications, equivalents, and alternatives falling within the scope of the described technology. In the following description, well-known functions or constructions are not described in detail if it is determined that they would obscure the described technology due to unnecessary detail.

It will be understood that although the terms "first", "second", etc. may be used herein to describe various components, these components should not be limited by these terms. These terms are only used to distinguish one component from another.

It will be understood that when a layer, region, or component is referred to as being "formed on," another layer, region, or component, it can be directly or indirectly formed on the other layer, region, or component. That is, for example, intervening layers, regions, or components may be present.

In the drawings, components that are substantially the same or that correspond to each other will be denoted by the same reference numeral and will not be redundantly described here. The sizes of the elements in the drawings may be exaggerated for the sake of clarity. In other words, such sizes and thicknesses of components in the drawings are not limiting to actual implementations.

As used herein, the term "and/or" includes any and all combinations of one or more of the associated listed items. Expressions such as "at least one of," when preceding a list of elements, modify the entire list of elements and do not modify the individual elements of the list.

Figure 2:
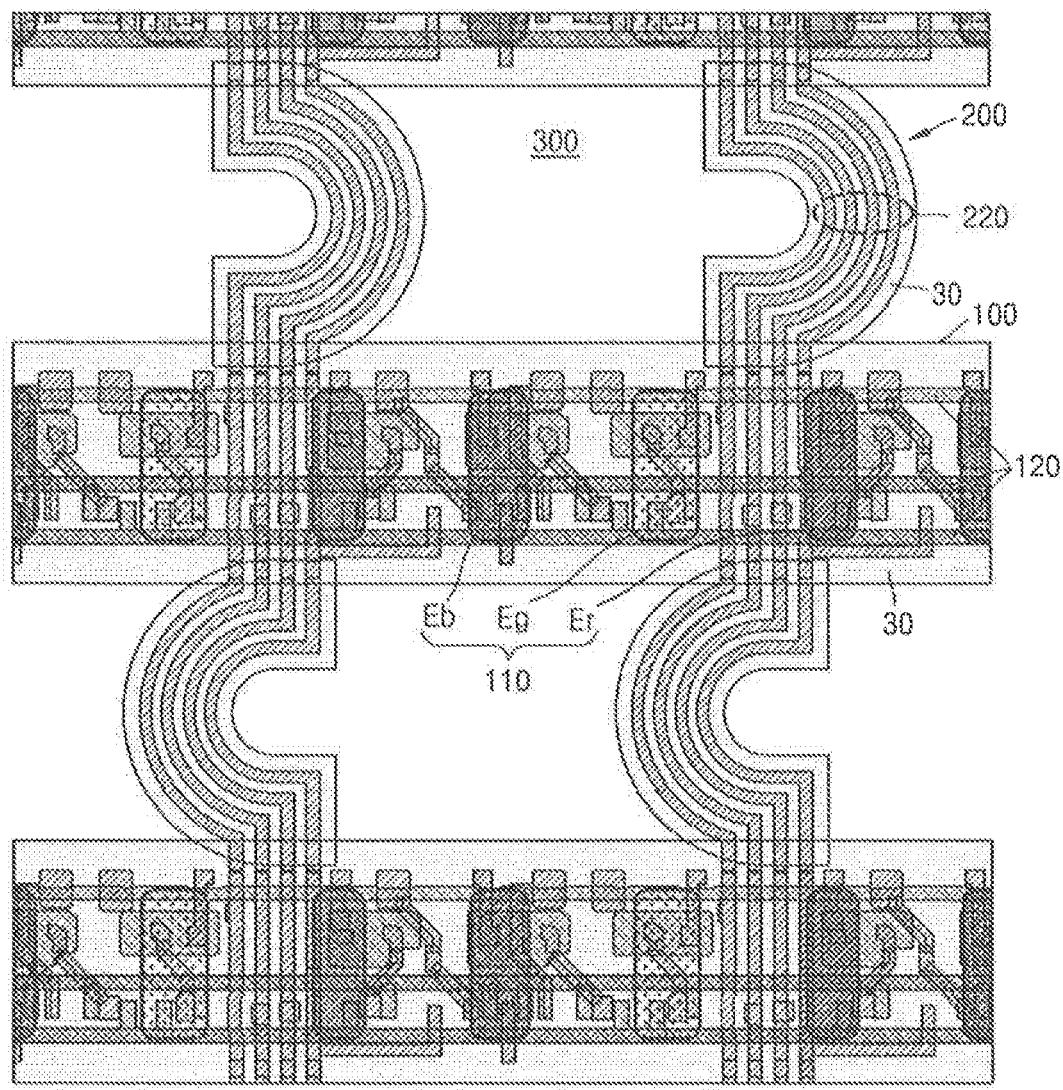
FIG. 2 is an enlarged plan view of the portion indicated by 'X' in FIG. 1.

FIG. 1 is a schematic plan view of a display device 1000 according to an exemplary embodiment. FIG. 2 is an enlarged plan view of the portion indicated by 'X' in FIG. 1.

Referring to FIGS. 1 and 2, the display device 1000 includes at least one first pattern unit or first pattern 100, at least one second pattern unit or second pattern 200, and at least one penetration unit or cavity region 300.

The at least one first pattern unit 100 includes a base 30 at a bottom thereof.

The base 30 can include various materials. In detail, the base 30 may be formed of glass, a metal, or other organic materials.

Alternatively, the base 30 can be formed by patterning a flexible material. For example, the base 30 can be formed of a material that can be bent, folded, or rolled up. The flexible material may be ultra-thin glass, metal, or plastic. When the base 30 includes plastic, the base 30 may be formed of, but is not limited to, a material having ductility and a high restoring force, e.g., a material such as one or more of: polyethersulphone (PES), polyethyeleneterepthalate (PET), polyethyelenen napthalate (PEN), polyimide (PI), and polycarbonate (PC). The base 30 can be formed of a material containing an organic material so that it can be flexible and strong.

The at least one first pattern unit 100 includes a plurality of display elements 110 for displaying an image. The display elements 110 are arranged on the at least one first pattern unit 100 in a first direction.

The display elements 110 are arranged in a line on a surface of the base 30 in the first direction. Referring to FIG. 2, although the display elements 110 are arranged in a row in the first direction, they can be arranged in a plurality of rows. The display elements 110 can generate visible light of various colors. In certain embodiments, the display elements 110 include a red element Er that generates red visible light, a green element Eg that generates green visible light, and a blue element Eb that generates blue visible light. Each of the display elements 110 can be an organic light-emitting diode (OLED), a liquid crystal element, or another display element. For convenience of explanation, it is assumed in the present disclosure that a display device according to an exemplary embodiment is an OLED display including OLEDs.

Since the OLEDs are susceptible to being damaged by the exposure to the environment, such as to oxygen or moisture, a protective film (not shown) can be adhered onto the base 30 to air-tightly protect the OLEDs. In some embodiments, the protective film includes a stack structure of a plurality of insulating films. In detail, organic films and inorganic films can be alternately stacked in the stack structure of the insulating films.

One pixel PXL includes at least one display element as described above to display an image. One pixel PXL can include a plurality of light-emitting regions. For example, one pixel PXL may include a red light-emitting region with a red element Er, a green light-emitting region with a green element Eg, and a blue light-emitting region with a blue element Eb. The pixel PXL having the above-described display elements will be described with reference to FIGS. 4 to 6 below.

The at least one first pattern unit 100 includes a plurality of wires. The wires may be formed on a layer below the display elements 110 of the at least one first pattern unit 100.

The at least one first pattern unit 100 can have a flat band shape. In this embodiment, when the base 30 formed at the bottom of the at least one first pattern unit 100 is formed in a band shape that is narrower than a flat panel, the thickness of a flexible organic material can be more easily controlled during patterning.

As described above, the at least one first pattern unit 100 can be flexible or foldable in the first direction since the base 30 at the bottom thereof is formed of a flexible organic material and a plurality of thin films each containing an organic film are stacked to seal the display elements arranged on the at least one first pattern unit 100. Also, the at least one first pattern unit 100 can be patterned in a narrow band shape to be more easily bent or folded in the first direction.

The at least one second pattern unit 200 extends in a second direction to overlap at least a portion of the at least one first pattern unit 100.

The at least one second pattern unit 200 includes a base 30 at a bottom thereof, similar to the at least one first pattern unit 100. Similarly, the base 30 of the at least one second pattern unit 200 can be formed by patterning a flexible material. In this embodiment, the base 30 can be formed of the same material as the base 30 of the at least one first pattern unit 100.

Similarly, the at least one second pattern unit 200 includes a plurality of wires. In some regions of the at least one first pattern unit 100, wires of the at least one first pattern unit 100 and wires of the at least one second pattern unit 200 cross so as to be electrically connected to each other.

As illustrated in FIGS. 1 and 2, the at least one second pattern unit 200 is patterned to have a curved shape in the first direction. Thus, the at least one second pattern unit 200 is elastic in the second direction such that the curved shape can be repeatedly stretchable and contractible. That is, the at least one second pattern unit 200 is stretchable in the second direction.

Each of the at least one penetration units 300 is formed to penetrate a space surrounded by adjacent two first pattern units 100 and adjacent two second pattern units 200. That is, each of the at least one penetration unit 300 is arranged between one first pattern unit 100 and another first pattern unit 100 adjacent to the first pattern unit 100 and between one second pattern unit 200 and another second pattern unit 200 adjacent to the second pattern unit 200.

In the at least one penetration unit 300, the base 30 defines an opening to the environment rather than enclosing the penetration unit 300. For example, the at least one penetration unit 300 can be included in the at least one first pattern unit 100 and the at least one second pattern unit 200 when the at least one first pattern unit 100 and the at least one second pattern unit 200 are manufactured. As another example, the at least one penetration unit 300 can be formed by removing a region of the base 30, for example, by etching. The at least one penetration unit 300 can be formed in various ways and a method of manufacturing the at least one penetration unit 300 is not limited.

By forming the at least one penetration unit 300 in a space surrounded by the at least one first pattern unit 100 and the at least one second pattern unit 200 as described above, a plurality of first pattern units 100 and a plurality of second pattern units 200 form a mesh structure. Thus, stress caused by an external stimulus such as bending, stretching, etc. can be dispersed, and the display device 1000, the shape of which can be changed individually in the first direction and the second direction can be provided.

Figure 3:
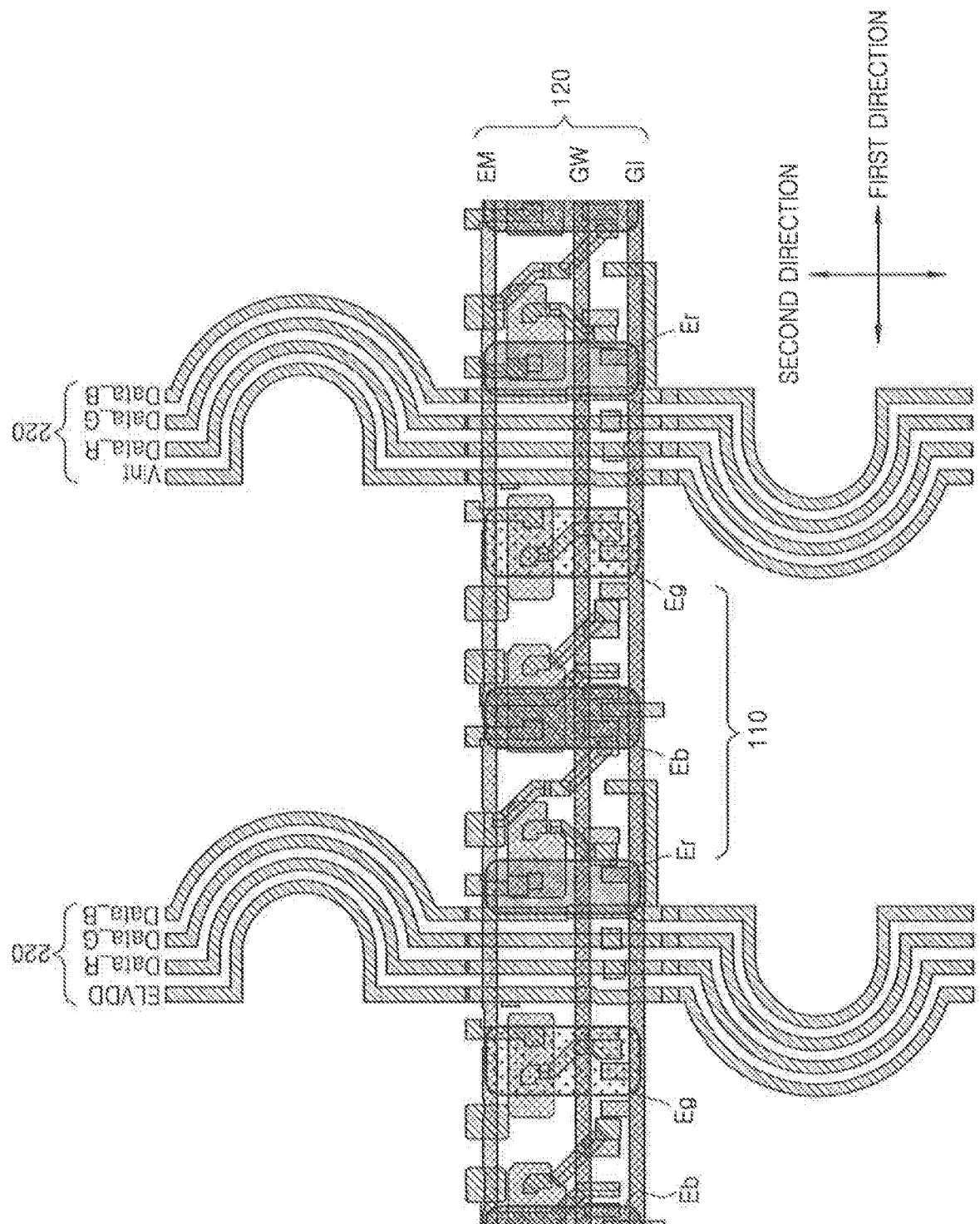
FIG. 3 is a schematic plan view of the arrangement of wires of FIG. 2.

FIG. 3 is a schematic plan view of the arrangement of the wires of FIG. 2.

Referring to FIG. 3, the at least one first pattern unit 100 includes a plurality of first wires 220 extending in the first direction. The first wires 220 can be arranged in parallel in the first direction.

The first wires 220 can include, but are not limited to, a scan line GW and a preceding scan line GI for transmitting a scan signal and a preceding scan signal to a pixel PXL and an emission control line EM for transmitting an emission control signal to the pixel PXL.

More specifically, in the illustrated embodiment, a scan driver (not shown) transmits two corresponding scan signals to each of the pixels PXL via the scan lines GW and GI. That is, a first scan signal can be transmitted via a scan line GW corresponding to a row including each of the pixels PXL in the first direction and a second scan signal can be transmitted via a preceding scan line GI to a preceding row. Also, the scan driver generates and transmits an emission control signal to each of the pixels PXL via a plurality of emission control lines EM. However, exemplary embodiments are not limited thereto and the display device 1000 can further include an emission control driver and the emission control signal can be generated by the emission control driver.

The at least one first pattern unit 100 can include not only the first wires 220 but also wires connecting the first wires 220, second wires 220, and the display elements 110.

The at least one second pattern unit 200 includes the second wires 220 extending in the second direction. The second wires 220 can be arranged in parallel in the second direction.

The second wires 220 can include data lines Data_R, Data_G, and Data_B that cross the scan lines GW and GI described above and via which a data signal is transmitted to each of the pixels PXL. The second wires 220 can also include a driving voltage line ELVDD via which a driving voltage is applied to each of the pixels PXL and that extends in parallel to the data lines Data_R, Data_G, and Data_B and a reset voltage line Vint for applying a reset voltage for resetting a driving thin-film transistor (TFT).

More specifically, a data driver transmits a data signal to each of the pixels PXL via the data lines Data_R, Data_G, and Data_B. Each of the pixels PXL emits light having a brightness based on the driving current supplied to the OLEDs according to the data signal transmitted to the pixel PXL via the data lines Data_R, Data_G, and Data_B. In the illustrated embodiment, the driving voltage line ELVDD is formed to be substantially parallel to the data lines Data_R, Data_G, and Data_B. Since a plurality of driving voltage lines ELVDD are connected in a mesh structure by additional wires (not shown) formed in the first direction, power can be supplied via the driving voltage lines ELVDD in the first direction and the second direction. Thus, the additional wires for supplying power reduce the resistance between the power supply and the pixels to prevent a voltage drop along the wires. Although the reset voltage line Vint is illustrated as being arranged substantially parallel to the data lines Data_R, Data_G, and Data_B, exemplary embodiments are not limited thereto and the reset voltage line Vint can be formed substantially parallel to the scan lines GW and GI.

As illustrated in FIG. 3, in particular, the data lines Data_R, Data_G, and Data_B among the second wires 220 are electrically connected to the display elements 110 (which are arranged on the first pattern unit 100 apart from each other) to transmit a data signal. For example, the red data line Data_R, the green data line Data_G, and the blue data line Data_B are respectively electrically connected to the red element Er, the green element Eb, and the blue element Eb. Also, driving power can be supplied to the red element Er, the green element Eb, and the blue element Eb via one driving voltage line ELVDD arranged in parallel to the data lines Data_R, Data_G, and Data_B. However, the design of the second wires 220 including the data line Data_R, Data_G, and Data_B, and the driving voltage line ELVDD is not limited to that described above.

As described above, the first and second wires 220 that cross in regions of the first pattern unit 100 can be formed on different layers. That is, in some embodiments, the first wires 220 acting as scan wires are arranged on a lower layer and the second wires 220 acting as data wires are arranged on an upper layer to prevent an increase in load on the wires and provide a more efficient use of space. An insulating layer (not shown) can be interposed between the first and second wires 220.

Various techniques can be used to pattern the wires 220. For example, electron beam evaporation, thermal evaporation, sputtering, electroplating, etc. can be used. In addition, the wires can be formed by performing a patterning process using photoresist and then performing a dry or wet etch process. Otherwise, the wires 220 can be directly printed using a printing process such as nano-imprinting or ink jet printing. In particular, the wires 220 need to be patterned to a sufficient thickness, considering that they may be stretched in the second direction.

The material used to form the wires 220 is not limited provided that the material conducts electric current and can be a metal. In this embodiment, the metal can be at least one of the following materials: gold (Au), silver (Ag), platinum (Pt), copper (Cu), nickel (Ni), chromium (Cr), aluminum (Al), tungsten (W), titanium (Ti), and palladium (Pd). The material of the wires 220 can be appropriately selected based on electrical and mechanical properties such as conductivity, ductility, malleability, etc.

Figure 4:
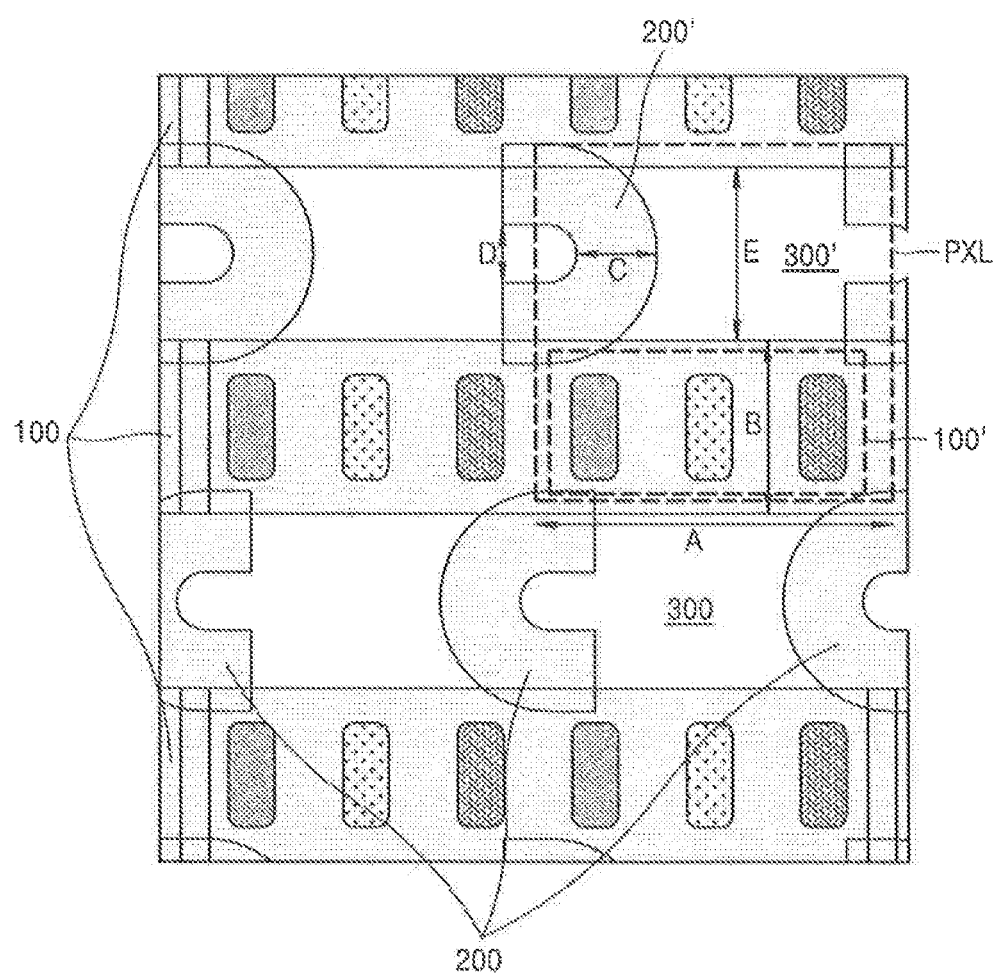
FIG. 4 is a schematic plan view of one of pixels of the display device of FIG. 1.

FIG. 4 is a schematic plan view of one of pixels of the display device 1000 of FIG. 1.

Referring to FIG. 4, a first pattern unit 100 includes a plurality of first sub-patterns unit or first sub-patterns 100', a second pattern unit 200 includes a plurality of second sub-pattern units or second sub-patterns 200', and a penetration unit 300 includes a plurality of sub-penetration units or cavity sub-regions 300'.

In this embodiment, one pixel PXL is formed by two adjacent first sub-pattern units 100', two adjacent second sub-pattern units 200' and a sub-penetration unit 300' interposed therebetween. When the length of one pixel PXL in the first direction is 'A', the length A is determined to be an appropriate value according to the resolution of the display device 1000.

As described above, one pixel PXL includes a plurality of light-emitting regions. For example, each of the light-emitting regions can emit red, green, or blue light. Also, in each of the light-emitting regions, a red element Er that generates red visible light, a green element Eb that generates green visible light, and a blue element Eb that generates blue visible light can be arranged. The light-emitting regions are formed in the first sub-pattern units 100'. When the width of a first sub-pattern unit 100' in the second direction is 'B', the width B can be determined according to the positions of a pixel circuit connected to each of light-emitting devices and the first wires 220, and is influenced by a light emission aperture ratio of each of the light-emitting regions.

The second sub-pattern units 200' have a curved shape in the first direction. The second sub-pattern units 200' can have various shapes according to a degree of strain applied thereto and the material of the substrate. The shapes of the second sub-pattern units 200' are not limited, provided that stress applied to the display device 1000 can be dispersed by the second sub-pattern units 200'. For example, the second sub-pattern units 200' can have a hemisphere shape or a screw shape. Also, some second wires 220 formed on the second sub-pattern unit 200' are formed in a curved shape corresponding to the shapes of the second sub-pattern unit 200'.

In the embodiment of FIG. 4, when the width of a portion of the second sub-pattern units 200', which is curved to a great extent in the first direction, is 'C', the width C is influenced by the material and features of the insulating films and is determined to be an appropriate value according to the number and position of the second wires 220.

Also, a concave groove is formed at an edge of each of the second sub-pattern units 200' in a direction in which the second sub-pattern units 200' are curved. When the width of the concave groove in the second direction is 'D', the stretchability of the second pattern unit 200 in the second direction is determined by the width D and a mechanical strength of the second sub-pattern unit 200' is influenced by the width D.

As described above, the second pattern unit 200 can act as a spring by forming a groove in the second sub-pattern unit 200'. That is, the curved shape of the second sub-pattern unit 200' is tightly stretched when the second pattern unit 200 is stretched in the second direction. Furthermore, portions of the second wires 220 arranged on the second sub-pattern unit 200' to correspond to the shape of the second sub-pattern unit 200' are also tightly stretched in the second direction.

The second sub-pattern units 200' and the second wires 220 arranged on the second sub-pattern units 200' can be formed to be bent in alternating directions with respect to the first pattern unit 100. Thus, wire resistances of the red element Er, the green element Eb, and the blue element Eb with respect to the first pattern unit 100 in the first direction are equalized to more stably drive the display device 1000. However, the pattern of the second sub-pattern units 200' and the second wires 220 is not limited to the embodiment illustrated in FIG. 2 or 3. For example, two second sub-pattern units 200' can be arranged between two adjacent first pattern units 100 in alternating orientations to form an 'S' shape. As another example, second sub-pattern units 200' curved in the same direction can be arranged in a plurality of rows and second sub-pattern units 200' curved in a different direction can be arranged in a plurality of rows adjacent to the plurality of rows, thereby balancing wire resistances.

A stack structure of first pattern units 100 and second pattern units 200 in a direction of the thickness thereof will be described below.

Figure 5:
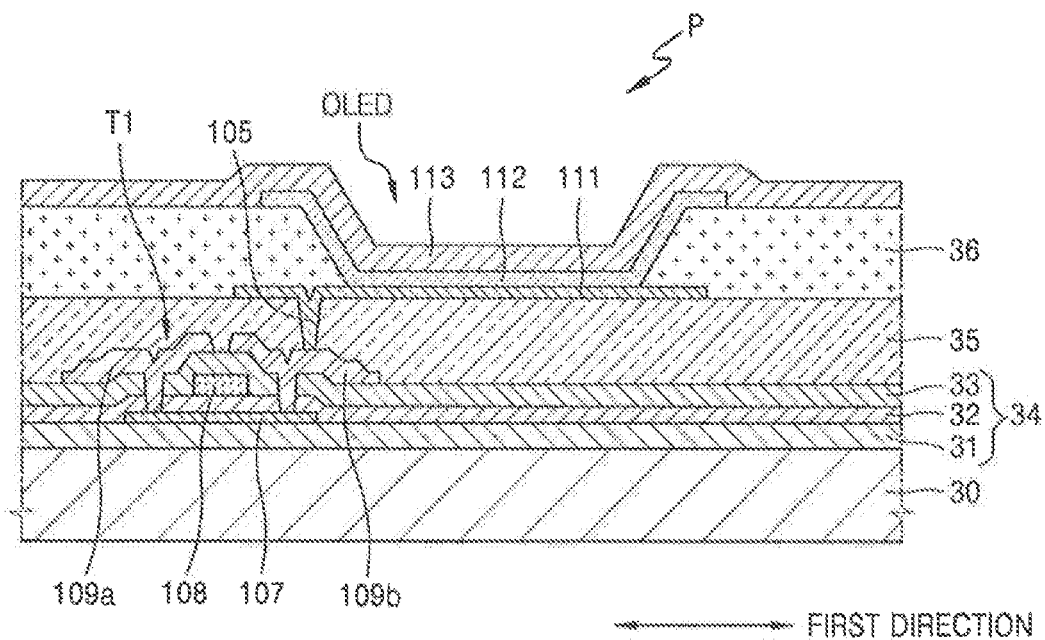
FIG. 5 is a cross-sectional view taken along line I-I' of FIG. 1.
Figure 6:
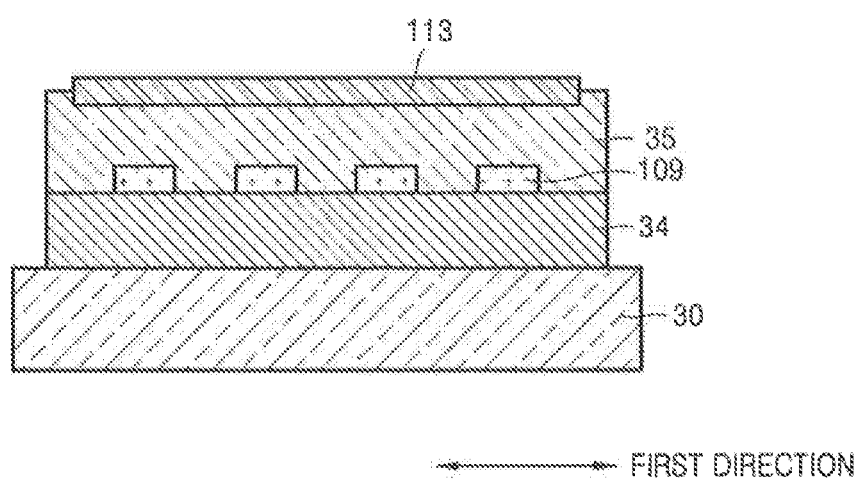
FIG. 6 is a cross-sectional view taken along line II-II' of FIG. 1.

FIG. 5 is a cross-sectional view taken along line I-I' of FIG. 1. FIG. 6 is a cross-sectional view taken along line II-II' of FIG. 1.

First, a cross-sectional view of the first pattern unit 100 including one OLED will be described with reference to FIG. 5. Here, for convenience of explanation, a region of a base or substrate 30 in which one OLED is included as a display element will be referred to as a display unit P.

The base 30 can be formed of a flexible material. For example, the base 30 can be formed of a plastic material. The plastic material can be an electrically insulating organic material such as one or more of: polyethersulphone (PES), polyacrylate (PAR), polyetherimide (PEI), polyethyelene napthalate (PEN), polyethyelene tereptphalate (PET), polyphenylene sulfide (PPS), polyallylate, polyimide (PI), polycarbonate (PC), triacetyl cellulose (TAC), and cellulose acetate propionate (CAP).

When the display device is a bottom emission type display in which an image can be viewed via the base 30, the base 30 should be formed of a transparent material. However, when the display device is a top emission type display in which an image can be view from a direction opposite to the base 30, the base 30 need not be formed of a transparent material.

Although the base 30 can be formed of a plastic material, an ultra-thin glass or a metal material can be used, provided that it has an electrically insulating property. When the base 30 is formed of a metal, the base 30 can include, but is not limited to, at least one of the following materials: carbon, iron, chromium, manganese, nickel, molybdenum, stainless steel (SUS), an Invar alloy, an Inconel alloy, and a Kovar alloy.

The display unit P can be formed on the base 30 and include a TFT T1 and an OLED.

Referring to FIG. 5, a buffer layer 31 can be formed on the base 30. The buffer layer 31 is a layer that protects the base 30 against impurities and provides a flat surface on the base 30. The buffer layer 31 can be formed of various materials that can provide the above functions of the buffer layer 31. For example, the buffer layer 31 can include an inorganic material such as silicon oxide ($SiO_x$), silicon nitride ($SiN_x$), silicon oxynitride ($SiO_xN_y$), aluminum oxide, aluminum nitride, titanium oxide, or titanium nitride; an organic material such as polyimide (PI), polyester, or acrylic, or may be a multi-layer film including at least one among these materials.

An active layer 107 is formed on the buffer layer 31 by using an inorganic semiconductor such as silicon or an organic semiconductor. The active layer 107 includes a source region, a drain region, and a channel region between the source region and the drain region. For example, when the active layer 107 is formed of amorphous silicon, the active layer 107 including the source region, the drain region, and the channel region between the source region and the drain region can be formed by forming an amorphous silicon layer on the entire base 30, crystallizing the amorphous silicon layer to form a polycrystalline silicon layer, patterning the polycrystalline silicon layer, and doping impurities into a source region and a drain region at edges of the resultant structure.

A gate insulating film 32 is formed on the active layer 107. The gate insulating film 32 electrically insulates the active layer 107 and a gate electrode 108 from each other and can be formed of an inorganic material such as silicon nitride ($SiN_x$), silicon oxide ($SiO_2$), etc.

The gate electrode 108 is formed in a predetermined upper region of the gate insulating film 32. The gate electrode 108 is connected to a gate line (not shown) for supplying an 'on'/'off' signal to the TFT T1. Here, a plurality of gate electrodes 108 can be formed and the gate insulating film 32 can be additionally interposed between the gate electrodes 108.

The gate electrode 108 can include Au, Ag, Cu, Ni, Pt, Pd, Al, or molybdenum (Mo) or an alloy such as an Al:Nd alloy or a Mo:W ally but is not limited thereto and may be formed of various materials in consideration of design conditions.

An interlayer insulating film 33 formed on the gate electrode 108 insulates a source electrode 109a and a drain electrode 109b and can be formed of an inorganic material such as $SiN_x$, $SiO_2$, etc.

The source electrode 109a and the drain electrode 109b are formed on the interlayer insulating film 33. In detail, the interlayer insulating film 33 and the gate insulating film 32 are formed to expose the source region and the drain region of the active layer 107. The source electrode 109a and the drain electrode 109b are formed to be in contact with the exposed source region and drain region of the active layer 107.

Although FIG. 5 illustrates a top gate type TFT in which the active layer 107, the gate electrode 108, the source electrode 109a, and the drain electrode 109b are sequentially formed, exemplary embodiments are not limited thereto and the gate electrode 108 can be formed below the active layer 107. More specifically, the TFT T1 can have a low-temperature polycrystaline silicon (LTPS) top gate structure, an oxide bottom gate structure, or an oxide top gate structure.

An insulating film stack structure 34 is formed on a region of the base 30 except for the TFT T1 by sequentially forming the buffer layer 31, the gate insulating film 32, and the interlayer insulating film 33.

The TFT T1 is electrically connected to the OLED so as to drive the OLED and is protected by being covered with a planarizing film 35.

The planarizing film 35 can include an inorganic insulating film and/or an organic insulating film. The inorganic insulating film may include one or more of: $SiO_2$, $SiN_x$, SiON, $Al_2O_3$, $TiO_2$, $Ta_2O_5$, $HfO_2$, $ZrO_2$, BST, PZT, etc. The organic insulating film may include a general-purpose polymer (PMMA or PS), a polymeric derivative having a phenol-based group, an acryl-based polymer, an imide-based polymer, an arylether-based polymer, an amide-based polymer, a fluorine-based polymer, a p-xylene-based polymer, a vinyl alcohol-based polymer, a mixture thereof, etc. Also, the planarizing film 35 can be a composite stack structure of an inorganic insulating film and an organic insulating film.

The OLED can include a first electrode 111, an intermediate layer 112, and a second electrode 113.

The first electrode 111 is formed on the planarizing film 35 and is electrically connected to the drain electrode 109b via a contact hole 105 formed in the planarizing film 35.

The first electrode 111 can be a reflective electrode and include a reflective film formed of Ag, magnesium (Mg), Al, Pt, Pd, Au, Ni, neodymium (Nd), iridium (Ir), Cr, or a mixture thereof and a transparent or semi-transparent electrode layer formed on the reflective film. The transparent or semi-transparent electrode layer may include at least one of the following materials: indium tin oxide (ITO), indium zinc oxide (IZO), zinc oxide (ZnO), indium oxide ($In_2O_3$), indium gallium oxide (IGO), and aluminum zinc oxide (AZO).

The second electrode 113 is formed opposite to the first electrode 111 and can be a transparent or semi-transparent electrode. The second electrode 113 can be formed of a metal thin film having a low work function and including Li, Ca, LiF/Ca, LiF/Al, Al, Ag, Mg, or a mixture thereof. Also, an auxiliary electrode layer or a bus electrode can be further formed on the metal thin film by using a transparent electrode forming material such as ITO, IZO, ZnO, $In_2O_3$, etc.

Thus, the second electrode 113 can allow light emitted from an organic emission layer (not shown) included in the intermediate layer 112 to pass therethrough. That is, the light emitted from the organic emission layer can be emitted directly toward the second electrode 113 or can be reflected from the first electrode 111 configured as a reflective electrode and emitted toward the second electrode 113.

However, the display device according to the present embodiment is not limited to a top emission type and can be a bottom emission type in which light emitted from the organic emission layer is discharged toward the base 30. In this embodiment, the first electrode 111 can be a transparent or semi-transparent electrode and the second electrode 113 can be a reflective electrode. Otherwise, the display device 1000 according to the present embodiment can be a dual emission type in which light is emitted in both a forward direction and a backward direction.

A pixel defining layer 36 is formed on the first electrode 111 by using an electrically insulating material. The pixel defining layer 36 can be formed by spin coating and using at least one of the following organic insulating materials: polyimide (PI), polyamide, acrylic resin, benzocyclobutene (BCB) and phenol resin. The pixel defining layer 36 exposes a predetermined region of the first electrode 111 and the intermediate layer 112 including the organic emission layer is formed on the exposed region of the first electrode 111.

The organic emission layer included in the intermediate layer 112 can be a low molecular weight organic material or a high molecular weight organic material. In addition to the organic emission layer, the intermediate layer 112 can selectively further include a functional layer such as a hole transport layer (HTL), a hole injection layer (HIL), an electron transport layer (ETL), an electron injection layer (EIL), etc.

Although not shown, an encapsulation layer (not shown) can be formed on the second electrode 113. The encapsulation layer can have a structure in which a plurality of inorganic films are stacked or an organic film and an inorganic film are alternately stacked. As another example, an encapsulation substrate (not shown) can be formed on the second electrode 113 so that the display device 1000 can be sealed with the encapsulation substrate.

Also, in order to protect the second electrode 113, a capping layer (not shown) can be interposed between the encapsulation layer/encapsulation substrate and the second electrode 113.

Next, a cross-sectional view of a second sub-pattern unit 200' will be described with reference to FIG. 6. In FIG. 6, components that are the same as those in FIG. 5 are denoted by the same reference numerals components and are not redundantly described here.

A base 30 can be formed of a flexible material similar to a first pattern unit 100. An insulating film stack structure 34 is formed on the base 30 by sequentially forming a buffer layer 31, a gate insulating film 32, and an interlayer insulating film 33.

A wire layer 109 is formed on the insulating film stack structure 34. The wire layer 109 can be formed of the same material as the source electrode 109a and the drain electrode 109b of FIG. 5. The wire layer 109 corresponds to the second wires 220 of FIGS. 2 and 3.

A planarizing film 35 is formed on the insulating film stack structure 34 to cover the wire layer 109. A second electrode 113 is formed on the planarizing film 35. The second electrode 113 is formed to cover the entire display device 1000 including the first pattern unit 100 of FIG. 5.

As described above, the display devices 1000 according to the one or more of the above embodiments can be embodied as having different functions in the first direction and the second direction.

Figure 7A:
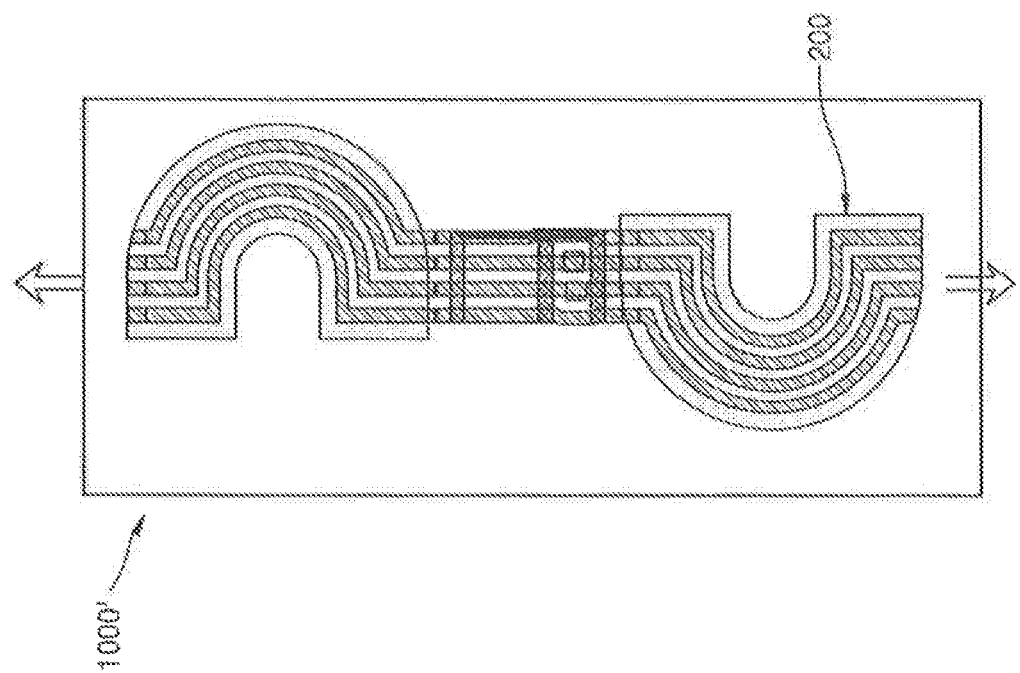
FIGS. 7A and 7B are diagrams schematically illustrating the display device of FIG. 1 when an external force is applied thereto.
Figure 7B:
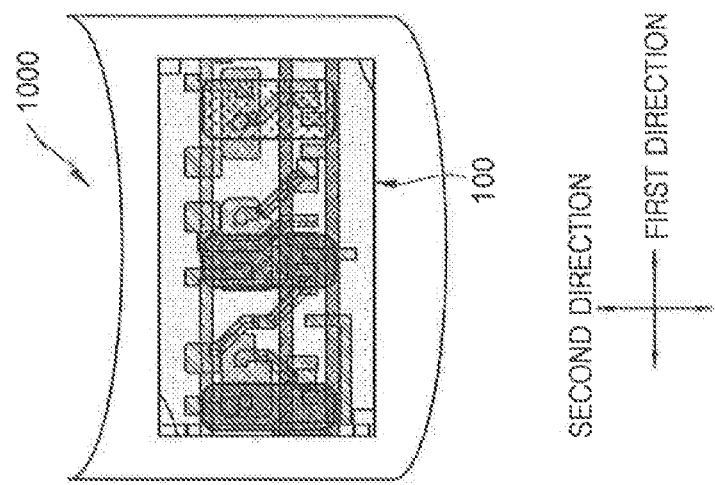

FIGS. 7A and 7B are diagrams schematically illustrating the display device 1000 of FIG. 1 when an external force is applied thereto.

Referring to FIG. 7A, the first pattern unit 100 is patterned in a narrow band shape in the first direction, so that the display device 1000 can be more easily bent or folded in the first direction. Thus, the display device 1000 can be flexible or foldable in the first direction.

Referring to FIG. 7B, the second pattern unit 200 is patterned in a curved shape in the second direction, so that the curved shape can be repeatedly stretched and contracted. That is, the curved shape can act as an elastic body and apply an elastic force to the display device 1000. Thus, the display device 1000 can be stretchable in the second direction.

As described above, display devices according to exemplary embodiments can be both stretchable and flexible.

Also, display devices according to exemplary embodiments can improve the user experience.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope of the invention as defined by the following claims.

What is claimed is:

1. A flexible display device, comprising:
a substrate including an opening;
a plurality of display elements disposed on the substrate and extending in a first direction; and
a plurality of first wires extending in the first direction, the plurality of first wires are respectively electrically connected to the display elements, and
a plurality of second wires disposed on the substrate, having a curved shape, and extending in a second direction cross to the first direction,
wherein the opening is surrounded by the plurality of display elements and the plurality of second wires.

2. The flexible display device of claim 1, wherein the curved shape includes a first curved portion and a second curved portion, wherein an open end of the first curved portion faces a direction different from an open end of the second curved portion.

3. The flexible display device of claim 1, wherein a portion of the opening has a shape corresponding to the curved shape.

4. The flexible display device of claim 1, wherein the opening includes a plurality of sub openings, each of the plurality of sub openings is surrounded by the plurality of display elements and the plurality of second wires.

5. The flexible display device of claim 1, wherein at least one of the second wires is a driving voltage line configured to apply a driving voltage to the at least one of the display elements.

6. The flexible display device of claim 1, further comprising a plurality of first wires extending in the first direction, and the plurality of first wires includes wires spaced apart from each other around the opening.

7. The flexible display device of claim 1, further comprising an insulating layer disposed between the plurality of first wires and plurality of the second wires.

8. The flexible display device of claim 1, wherein the plurality of second wires includes a first sub-wire and the second sub-wire spaced apart from each other around the opening, and at least two display elements emitting different colors are arranged between the first sub-wire and the second sub-wire.

9. The flexible display device of claim 1, wherein the substrate includes an organic material.

10. The flexible display device of claim 1, wherein each of the plurality of the display elements comprises:
   a first electrode;
   a second electrode; and
   an intermediate layer interposed between the first electrode and the second electrode, wherein the intermediate layer comprises an organic emission layer.

\* \* \* \* \*